(12) United States Patent
Lin

(10) Patent No.: US 11,443,814 B1
(45) Date of Patent: Sep. 13, 2022

(54) MEMORY STRUCTURE WITH MARKER BIT AND OPERATION METHOD THEREOF

(71) Applicant: Winbond Electronics Corp., Taichung (TW)

(72) Inventor: Chi-Shun Lin, Fremont, CA (US)

(73) Assignee: Winbond Electronics Corp., Taichung (TW)

(*) Notice: Subject to any disclaimer, the term of this patent is extended or adjusted under 35 U.S.C. 154(b) by 0 days.

(21) Appl. No.: 17/331,661

(22) Filed: May 27, 2021

(51) Int. Cl.
*G11C 16/10* (2006.01)
*G11C 16/16* (2006.01)
*G11C 16/26* (2006.01)
*G11C 16/08* (2006.01)

(52) U.S. Cl.
CPC ............. *G11C 16/16* (2013.01); *G11C 16/08* (2013.01); *G11C 16/26* (2013.01)

(58) Field of Classification Search
CPC .................................................... G11C 16/107
See application file for complete search history.

(56) References Cited

U.S. PATENT DOCUMENTS 9,286,160 B2    3/2016  Manda et al.
2020/0294603 A1*  9/2020 Harada ............... G11C 16/107

FOREIGN PATENT DOCUMENTS

CN    109841259    6/2019
TW    I459203      11/2014

* cited by examiner

*Primary Examiner* — Jason Lappas
(74) *Attorney, Agent, or Firm* — JCIPRNET

(57) ABSTRACT

A memory structure and an operation method are provided. The memory structure comprises a memory array, having plural blocks, each of the blocks having plural word lines coupled to memory cells; and one marker bit column having one or plural marker bit units, and the one plural marker bit units being coupled to one or the plural word lines. In performing a block erase operation to the blocks of the memory array, for each block, the controller pre-reads the data from the marker bit unit is pre-read, and the marker bit unit is erased during performing the block erase operation if the marker bit indicates a program state, and the block erase operation is skipped if the marker bit indicates an erase state.

16 Claims, 6 Drawing Sheets

MEMORY STRUCTURE WITH MARKER BIT AND OPERATION METHOD THEREOF

BACKGROUND

Technical Field

The invention relates to a memory structure with marker bit and an operation method thereof.

Description of Related Art

To perform an erase operation, a block erase is always performed for memory such as a flash memory. By using the block erase, memory cells formed in the same well can be erased together in each operation, which is a very effective way to erase the flash memory. Although the flash memory can be erased block by block, it still takes time to complete the erase operation.

To reduce chip erase time, a block pre-read operation to the data stored in the memory array before the erase operation has been implemented in current design. In this current erase operation, it determines the block erase operation could be skipped if the data in the memory array is all 1. In this way, the chip erase time is reduced.

However, the entire block pre-read block operation may still take some time to finish, it is necessary to develop a way to further reduce the chip erase time.

SUMMARY

According to one embodiment of the disclosure, a memory structure with marker bit is provided. The memory structure comprises a memory array, having a plurality of blocks, each of the plurality of blocks having a plurality of word lines coupled to memory cells; at least one marker bit column having at least one marker bit unit used as a marker bit, and the at least one marker bit unit being coupled to at least one of the plurality of word lines; and a controller performing controls on the memory array. In performing a program operation to the memory array, for each of the plurality of blocks, the controller pre-reads data from the at least one marker bit unit, and programs the at least one marker bit unit and performs the program operation to the memory array if the data is a first digital value that indicates an erase state. In performing a block erase operation to the blocks of the memory array, for each of the plurality of blocks, the controller pre-reads the data from the at least one marker bit unit and erases the at least one marker bit unit during performing the block erase operation to the blocks of the memory array if the data is a second digital value that indicates a program state, and the controller skips the block erase operation if the data is the first digital value.

According to another embodiment of the disclosure, an operation method for a memory structure with marker bit is provided. The memory structure including a memory array that has a plurality of blocks and each of the plurality of blocks has a plurality of word lines; and at least one marker bit column having at least one marker bit unit used as a marker bit, and the at least one marker bit unit being coupled to at least one of the plurality of word lines. The operation method comprises: in performing a program operation to the memory array, for each of the plurality of blocks, pre-reading data from the at least one marker bit unit, and programing the at least one marker bit unit and performs the program operation to the memory array if the data is a first digital value that indicates an erase state; and in performing a block erase operation to the blocks of the memory array, for each of the plurality of blocks, pre-reading the data from the at least one marker bit unit, erasing the at least one marker bit unit during performing the block erase operation to the blocks of the memory array if the data is a second digital value that indicates a program state, and the skipping the block erase operation if the data is the first digital value.

DESCRIPTION OF THE EMBODIMENTS

Figure 1A:
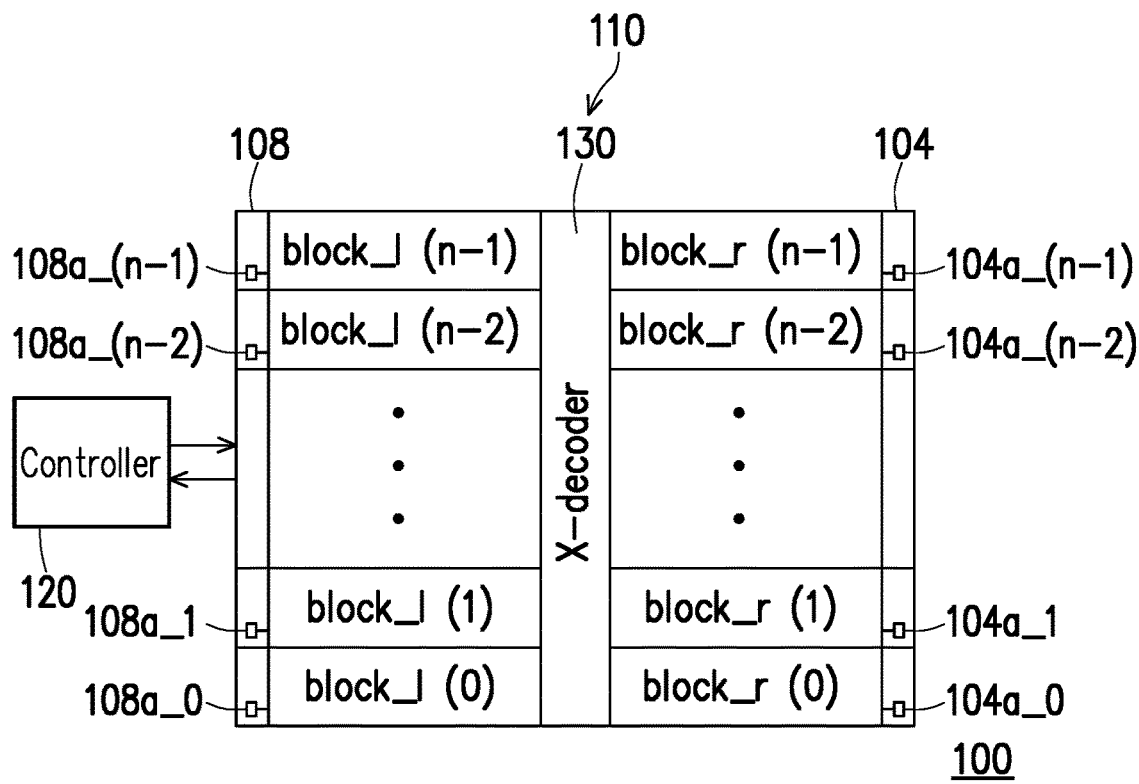
FIGS. 1A-1B and 2A-2B show schematic memory structures according to different embodiments of the disclosure.
Figure 1B:
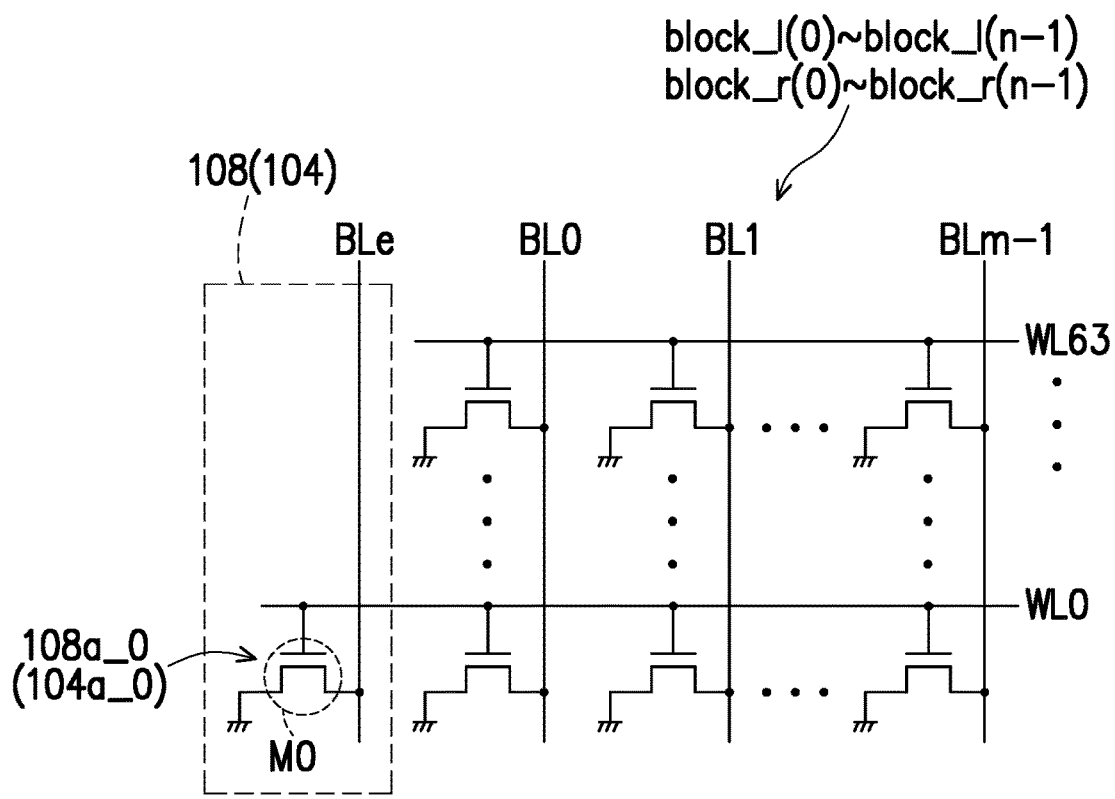

FIGS. 1A and 1B show a schematic memory structure according to one embodiment of the disclosure. FIG. 1A shows a schematic block diagram showing a memory structure and FIG. 1B shows a schematic cell diagram of FIG. 1A.

As shown in FIG. 1A, a memory structure 100 with marker bit can comprises a memory array (not fully shown) 110, and the memory array 110 can further comprises a plurality of blocks block_1 (0), . . . . , block_1 (n-1) and block_r (0), . . . , block_r (n-1). A common X-decoder 130 is also provided to decode the addresses of word lines WL. Although not shown in FIGS. 1A and 1B, the memory structure 100 may further comprises Y-decoder to decode the addresses of bit lines BL0~BLm-1 (see FIG. 1B), data buffer, command register, address register, status register, etc., and the embodiment can be understood without introducing these well-known detail circuit configurations.

In each block, such as the block_1 (0) or other blocks shown in FIG. 1B, a plurality of word lines WL is further provided, and plural memory cells may be coupled to each word line WL. As shown in FIG. 1B, an example that the block_1 (0) has 64 word lines WL0~WL63 are illustrated, but not limited thereto.

In addition, the memory structure 100 may further comprises a controller 120 for performing controls on the memory array, such as read, erase, program, etc. In general, the controller 120 is coupled to the memory array 110 so as to carry out various controls and operations.

As shown in FIG. 1A, a marker bit column 108 is further provided for the left blocks block_1 (0), . . . , block_1 (n-1), and a marker bit column 104 is further provided for the right blocks block_r (0), . . . , block_r (n-1). According to this embodiment, marker bit units 108a_0~108a_(n-1) are respectively provided for each block_1 (0), . . . , and block_1 (n-1). In addition, marker bit units 104a_0~104a_(n-1) are respectively provided for each block_r (0), . . . , block_r (n-1). Namely, in the embodiment, each block has one marker bit unit. In the following description, the block_1 (0) is used as an example, and the other blocks have the same configuration.

According to the embodiment, as shown in FIG. 1B, the marker bit unit 108a_0 (or 108a_1~108a_(n-1), 104a_1~104a_(n-1)) is coupled to the first word line WL0 of the block_1 (0) may comprise one marker bit cell M0 to function as a marker bit. The marker bit cell M0 is basically the same as the memory cells provided in each block, such as the block_1 (0). In a case of sequential program operation, the first word line WL0 is firstly selected to be programmed, and therefore, the marker bit unit 108a_0 is provided to be coupled to the first word line WL0. In this way, when pre-reading the marker bit, the pre-reading time can be further reduced. In this embodiment, the gate of the marker bit cell M0 is also coupled to the word line WL0 and one end of the marker bit cell M0 is coupled to a bit line BLe. In addition, plural cells may be provided as the marker bit unit 108a_0, which will be further described below.

Furthermore, although not shown in FIGs. 1A and 1B, a sensing amplifier and a writing driver for the marker bit unit are provided. The sensing amplifier and the writing driver are independent from those for the cells in the blocks.

The marker bit may be programmed or erased so as to store a first digital value (such as "1") or a second digital value (such as "0"). Therefore, the marker bit having the data of "1" may indicate an erase state, which means the block has been erased. In addition, the marker bit having the data of "0" may indicate a program state, which means the block has been programmed. Thus, by pre-reading the data stored in the marker bit of the corresponding block, it may determine whether the block has been erased or programmed.

According to the embodiment, in performing a program operation to block_1 (0) of the memory array 110 as an example, the controller 120 pre-reads the data from the marker bit unit (marker bit cell, in this embodiment). If the data of the marker bit cell M0 is "1" that indicates an erase state, it represents that marker bit cell M0 is not programmed. In this case, after receiving the program command, the controller 120 performs the program operation that the cells of the block_1 (0) on the selected word line and the marker bit cell M0 is also programmed to indicate the "program state".

In contrast, the data of the marker bit cell M0 is pre-read as "0" that indicates the program state, it represents that marker bit cell M0 is programmed. In this case, after receiving the program command, the controller 120 performs the program operation on the cells of the block_1 (0) on the selected word line and skips the program operation on the marker bit cell M0.

In addition, in performing a block erase operation to the block_1 (0) of the memory array 110 as an example, the controller 120 pre-reads the data from the marker bit unit (marker bit cell, in this embodiment). If the data of the marker bit cell M0 is "0" that indicates the program state, it represents that marker bit cell M0 is programmed and the corresponding block_1(0) is also the "program state". In this case, after receiving the erase command, the controller 120 performs the block erase operation on the block_1 (0) and the data of the marker bit cell M0 is also erased during the block erase operation.

In contrast, if the data of the marker bit cell M0 is pre-read as "1" that indicates the erase state, it represents that marker bit cell M0 is erased and the corresponding block_1 (0) is also in the "erase state". In this case, after receiving the erase command, the controller 120 skips the block erase operation.

During the block erase operation, since the memory cells in the same block and the marker bit cells are formed in the same will, the marker bit cells and the memory cells of the block can be erased at the same time.

Figure 2A:
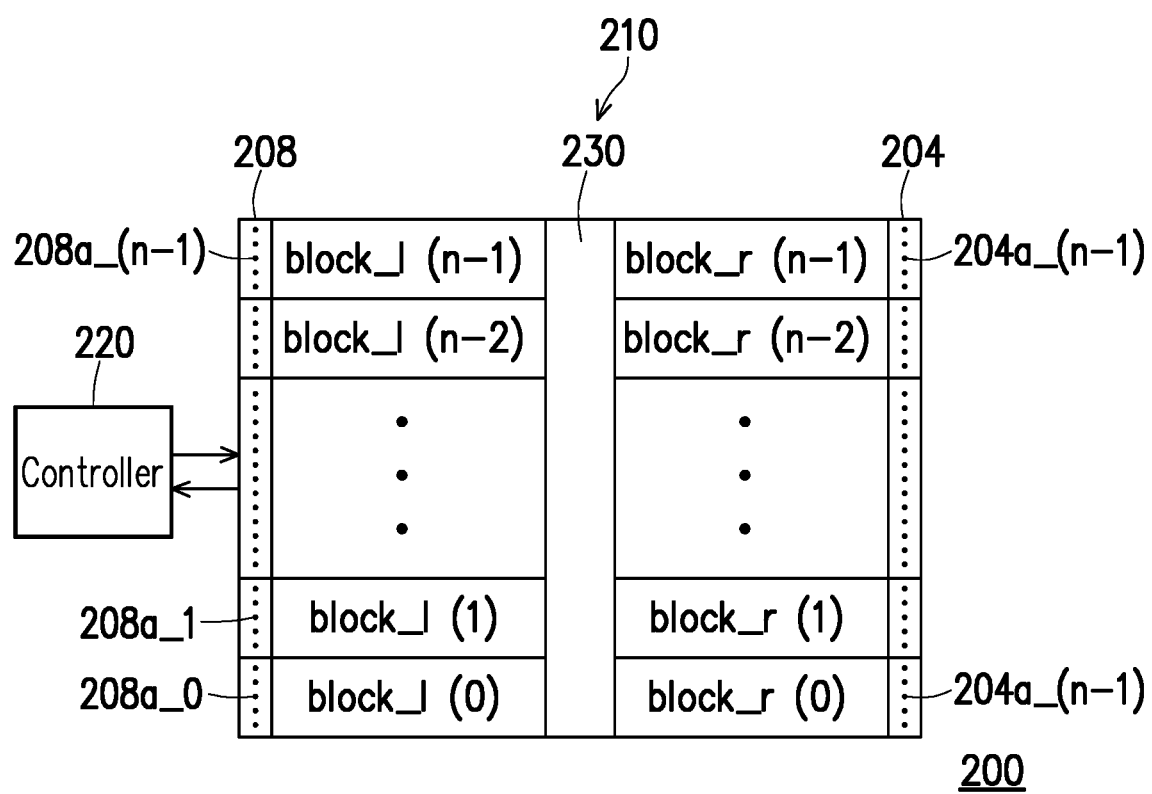
Figure 2B:
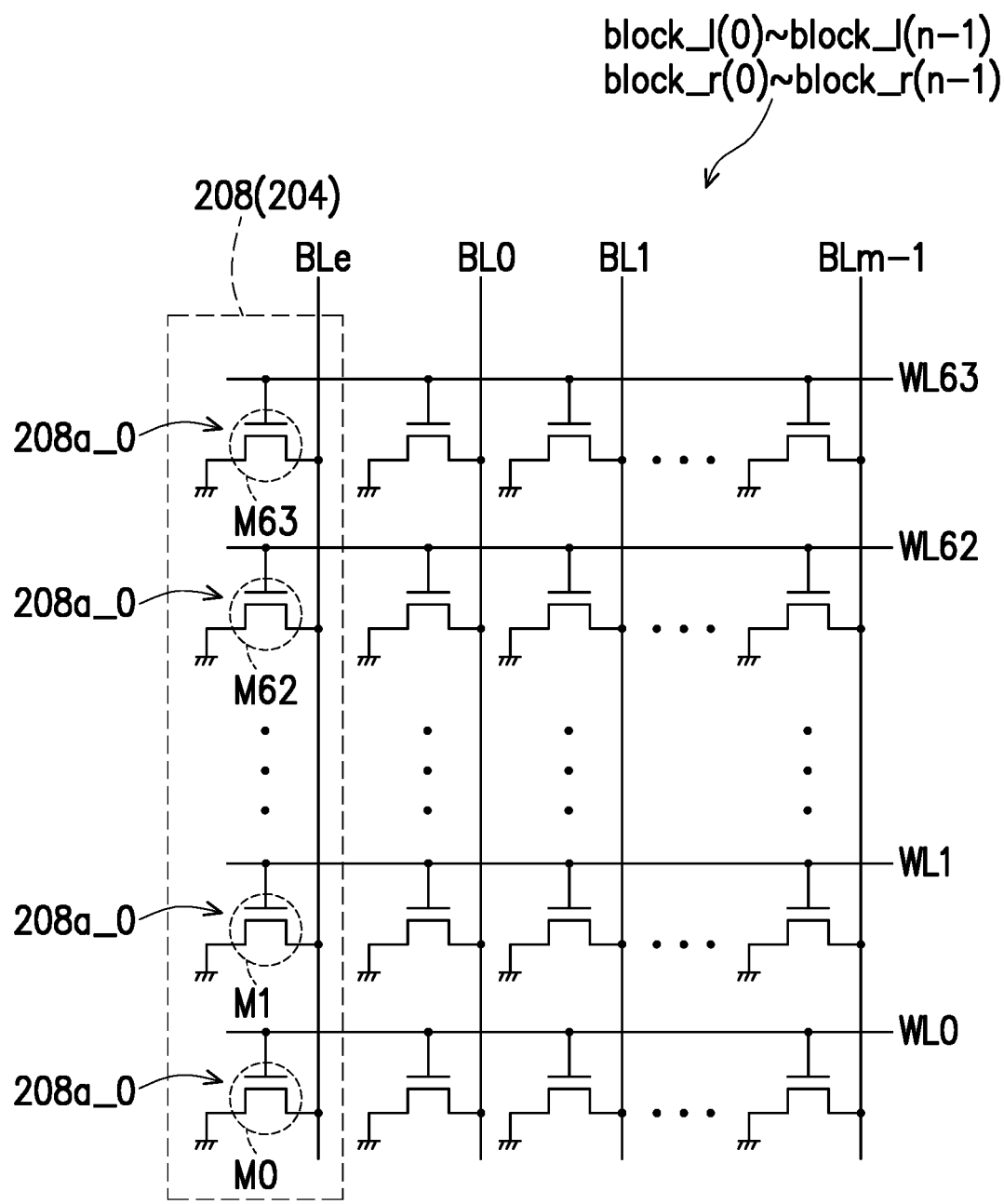

FIGS. 2A and 2B show a schematic memory structure according to another embodiment of the disclosure. FIG. 2A shows a schematic block diagram showing a memory structure and FIG. 2B shows a schematic cell diagram of FIG. 2A.

As shown in FIG. 2A, a memory structure 200 with marker bit can comprises a memory array (not fully shown) 210, and the memory array 210 can further comprises a plurality of blocks block_1 (0), . . . , block_1 (n-1) and block_r (0), . . . , block_r (n-1). A common X-decoder 230 is also provided to decode the addresses of word lines WL. Although not shown in FIGS. 2A and 2B, the memory structure 200 may further comprises Y-decoder to decode the addresses of bit lines BL0~BLm-1 (see FIG. 2B), data buffer, command register, address register, status register, etc., and the embodiment can be understood without introducing these well-known detail circuit configurations.

In each block, such as the block_1 (0) or other blocks shown in FIG. 2B, a plurality of word lines WL is further provided, and plural memory cells may be coupled to each word line WL. As shown in FIG. 2B, an example that the block_1 (0) has 64 word lines WL0~WL63 are illustrated, but not limited thereto. In addition, the memory structure 200 may further comprises a controller 220 for performing controls on the memory array, such as read, erase, program, etc. In general, the controller 220 is coupled to the memory array 210 so as to carry out various controls and operations.

As shown in FIG. 2A, a marker bit column 208 is further provided for the left blocks block_1 (0), . . . , block_1 (n-1), and a marker bit column 204 is further provided for the right blocks block_r (0), . . . , block_r(n-1). According to this embodiment, marker bit units 208a_0~208a_(n-1) are respectively provided for each block_1 (0), . . . , and block_1 (n-1). In addition, marker bit units 204a_0~204a_(n-1) are respectively provided for each block_r (0), . . . , block_r (n-1). Namely, in the embodiment, each block has a plurality of marker bit units. For example, the block_1 (0) has a plurality of marker bit units 208a_0 and the block_r (0) has a plurality of marker bit units 204a_0. In the following description, the block_1 (0) is used as an example, and the other blocks have the same configuration.

According to the embodiment, as shown in FIG. 2B that using the block block_1 (0) as an example, each block_1 (0) has a plurality of marker bit units 208a_0, and the number of the marker bit units 208a_0 is the same as the number of the word lines of the block_1 (0). As shown in FIGS. 2A and 2B, the marker bit units 208a_0 are respectively coupled to the word lines WL0~WL63 of the block_1 (0); that is, each marker bit units 208a_0 is coupled to a corresponding word line WL. Also, in this embodiment, each marker bit unit 208a_0 may comprise one marker bit cell M0 (~M63) to function as a marker bit. The marker bit cells M0~M63 are basically the same as the memory cells provided in each block, such as the block_1 (0). In this embodiment, the gates of the marker bit cells M0~M63 are respectively and one-to-one coupled to the word lines WL0~WL63 and one ends of the marker bit cells M0~M63 are coupled to a bit line BLe. In addition, plural cells may be provided as one marker bit unit 208a_0, which will be further described below.

Furthermore, although not shown in FIGS. 2A and 2B, a sensing amplifier and a writing driver for the marker bit unit are provided. The sensing amplifier and the writing driver are independent from those for the cells in the blocks.

According to the embodiment, the program procedure is not a sequential program operation like the embodiment shown in FIGs. 1A and 1B. The sequence for selecting cells on a word line to be programmed is random. In performing a program operation to block_1 (0) of the memory array 110 as an example, the controller 120 pre-reads the data from one of the marker bit units 208a_0 (marker bit cell, in this embodiment) correspond to a selected word line of block_1 (0). If the data of the marker bit cell M0 is "1" that indicates an erase state, it represents that marker bit cell M0 is not programmed. In this case, after receiving the program command, the controller 220 performs the program operation that the cells of the block_1 (0) on the selected word line and the marker bit cell M0 of the corresponding marker bit unit 208a_0 is also programmed to indicate the "program state". In one case, the marker bit cell may be not one the same word line that is selected to be programmed.

In contrast, the data of the marker bit cell M0 is pre-read as "0" that indicates the program state, it represents that marker bit cell M0 is programmed. In this case, after receiving the program command, the controller 220 performs the program operation on the cells of the block_1 (0) on the selected word line and skips the program operation on the marker bit cell M0.

In addition, in performing a block erase operation to the block_1 (0) of the memory array 110 as an example, the controller 120 pre-reads the data from all the marker bit units (marker bit cell, in this embodiment) 208a_0. If the data of any of the marker bit cells M0~M63 is "0" that indicates the program state, it represents that at least one of the marker bit cells M0~M63 is programmed and the block_1 (0) is also the "program state". In this case, after receiving the erase command, the controller 220 performs the block erase operation on the block_1 (0) and the data of the marker bit cells M0~M63 are also erased during the block erase operation.

In contrast, if the data of any of the marker bit cells M0~M63 is pre-read as "1" that indicates the erase state, it represents that marker bit cells M0~M63 are erased and the corresponding block_1 (0) is also in the "erase state". In this case, after receiving the erase command, the controller 220 skips the block erase operation.

During the block erase operation, since the memory cells in the same block and the marker bit cells are formed in the same will, the marker bit cells and the memory cells of the block can be erased at the same time.

Figure 3A:
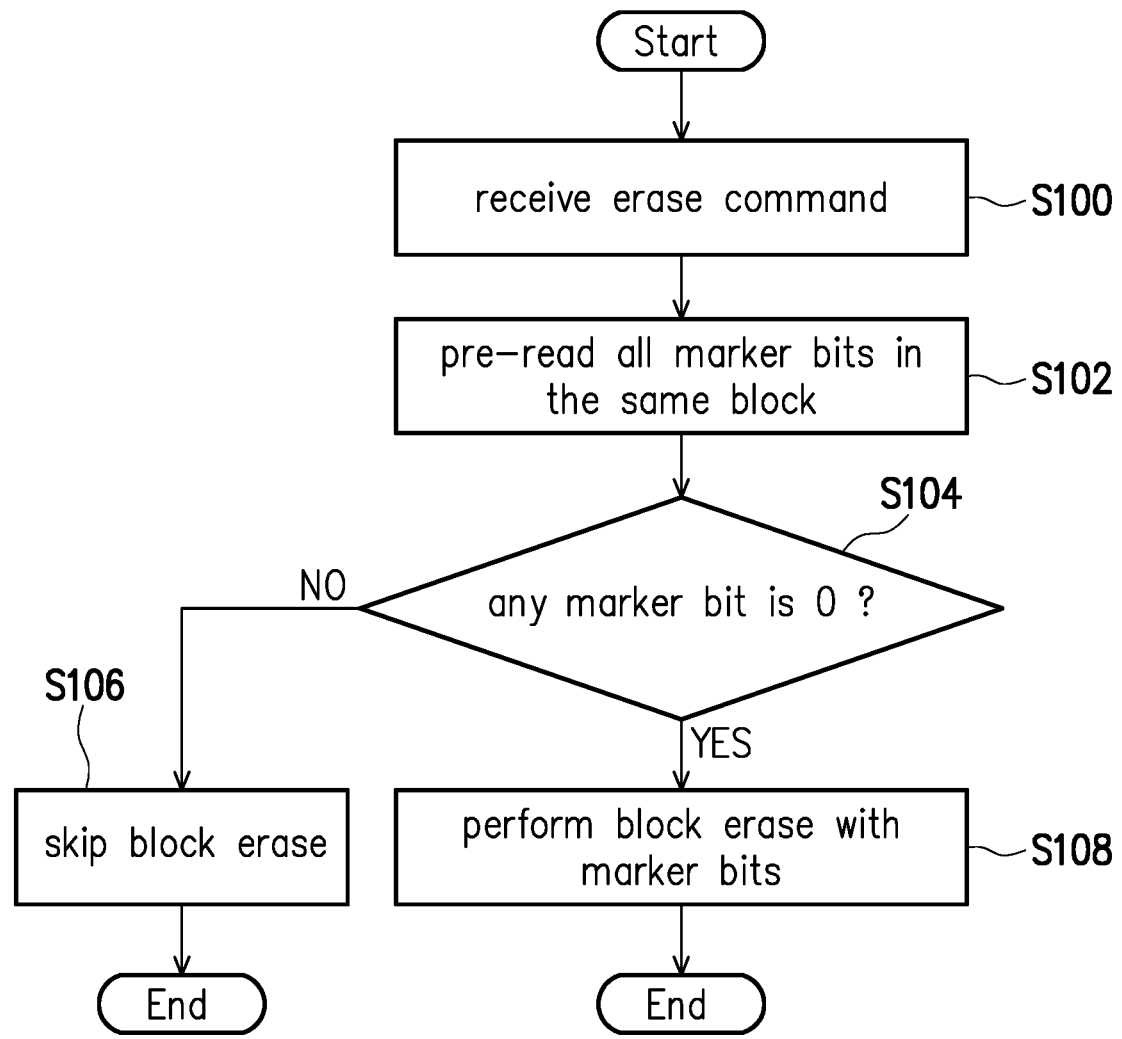
FIGS. 3A and 3B show flow chart for performing erase and program operation according to embodiments of the disclosure.
Figure 3B:
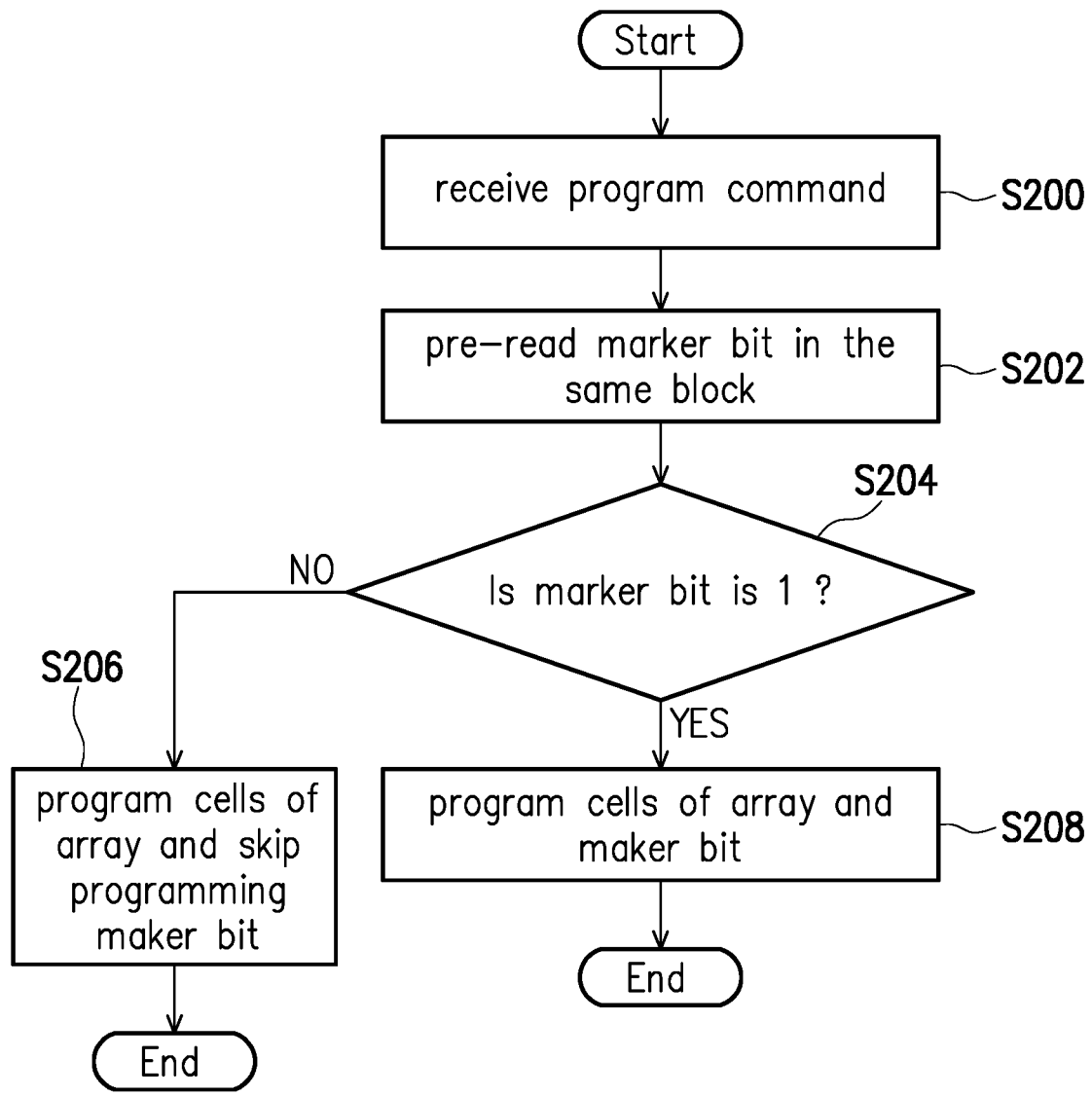

FIGS. 3A and 3B show flow chart for performing erase and program operation according to embodiments of the disclosure. In the following descriptions, one block of the memory array is used as an example for describing the erase and program operations, and these operations are the same for the other blocks and their descriptions are omitted.

FIG. 3A shows a flow chart for performing an erase operation according to the embodiment of the disclosure. As shown in FIG. 3A, in step S100, an erase command (block erase) is received and the controller prepares to perform an erase operation on the blocks of the memory array.

In step S102, all marker bits (marker bit unit) in the same block are pre-read. For example, one marker bit (marker bit unit, such as 108a_0) in the block (block_1 (0)) is pre-read in the case shown in FIGS. 1A and 1B, and all marker bits (marker bit units, such as 208_a_0) in the block (block_1 (0)) are pre-read in the case shown in FIGS. 2A and 2B.

In step S104, it determines whether any of the marker bits is 0 (i.e., the erase state). If the determination result is "Yes", it proceeds to step S108. In step S108, the block erase operation is performed on the cells of the block and the marker bit(s) of the block is (are) also erased during the block erase operation. Then, the block erase operation is ended. In addition, for the configuration shown in FIGS. 1A and 1B, only one marker bit (marker bit unit) in one block is determined whether the marker bit is "0" or "1". But, for the configuration shown in FIGS. 2A and 2B, all marker bits (marker bit units) in one block are pre-read and determined whether any of the marker bits is "0".

In contrast, if the determination result is "No", it proceeds to step S106. In step S106, since the pre-read marker bit(s) indicates that the cells in the block and the marker bit(s) are in the "erase state", it is not necessary to further perform the block erase operation. Therefore, in this situation, the block erase operation will be skipped in step S106. Then, the block erase operation is ended.

FIG. 3B shows a flow chart for performing a program operation according to the embodiments of the disclosure. As shown in FIG. 3B, in step S200, a program command is received and the controller prepares to perform a program operation on the blocks of the memory array.

In step S202, the data of the marker bit in the block to be programmed is pre-read from the marker bit unit. For example, one marker bit (marker bit unit, such as 108a_0) in the block (block_1 (0)) is pre-read in the case shown in FIGS. 1A and 1B. In this case of sequential program, each block has one marker bit related to the first word line WL0 (see FIG. 1B). In another example, one of the marker bits (marker bit units, such as 208a_0) in the block (block_1 (0)) is pre-read in the case shown in FIGS. 2A and 2B. In this case, the program procedure is not sequentially from the first word line, but performed by randomly selecting the word line.

In step S204, it determines whether the pre-read marker bit is "1" (the erase state). If the determination result is "Yes", it proceeds to step S208. In step S208, the cells of the block in the memory array are programmed and the marker bit of the block is also programmed during the program operation. Then, the program operation is ended.

In contrast, if the determination result is "No", it proceeds to step S206. In step S206, since the pre-read marker bit is "0" and indicates that the marker bit is in the "program state". Therefore, in this situation, the program operation on the marker bit will be skipped. Then, the program operation is ended.

In the above embodiments, examples that the marker bit unit has one marker bit cell are used to describe the erase and program operations with marker bit of the disclosure, but the disclosure is not limited thereto. For example, the marker bit unit may comprise a plurality of marker bit cells.

Figure 4:
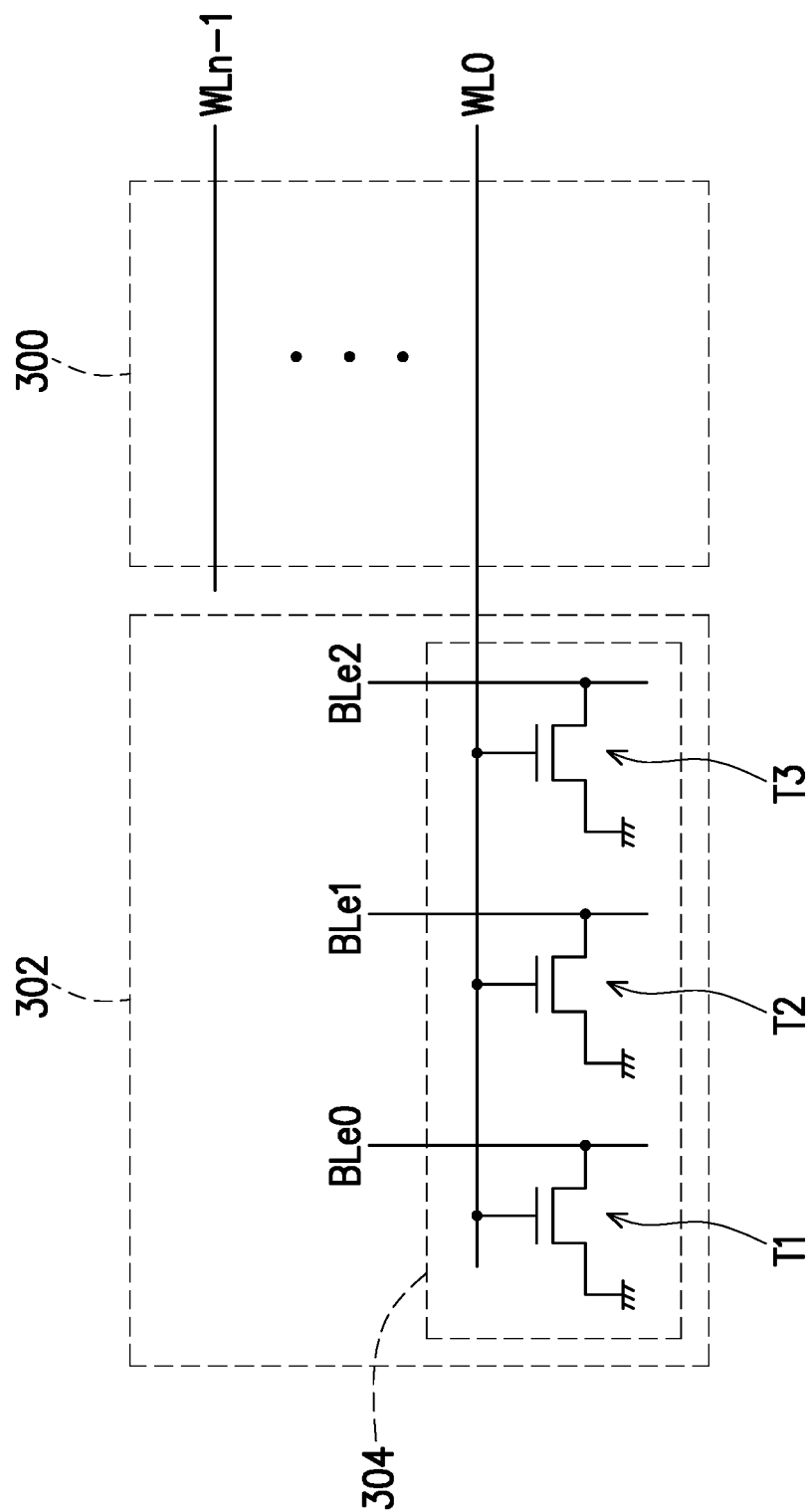
FIG. 4 shows an example with a configuration that the marker bit unit has three marker bit cells.

FIG. 4 shows an example with a configuration that the marker bit unit has three marker bit cells. In FIG. 4, similar to the above embodiment, one block 300 of the memory array and marker bit columns 302 are depicted. The block 300 includes a plurality of word lines (such as WL0, . . . , WL(n-1)), and the marker bit columns 302 includes at least one marker bit unit 302. In this example, the marker bit unit 302 has three marker bit cells T1, T2 and T3. Also, in this example, one marker bit unit 302 is illustrated and is coupled to the first word line WL0, which is similar to the configuration shown in FIGS. 1A and 1B. In one embodiment, n marker bit units 302 may be provided in a way that the n marker bit units 302 are respectively coupled to the plurality of word lines WL0, . . . , WL(n-1), one-to-one, which is similar to the configuration shown in FIGS. 2A and 2B.

As shown in FIG. 4, the marker bit cells T1, T2 and T3 may be implemented as the memory cells (not shown) in the block 300. Gates of the marker bit cells T1, T2 and T3 are coupled to the first word line WL0. One ends of the marker bit cells T1, T2 and T3 are respectively couples to bit lines BLe0, BLe1, BLe2.

In the case of using the marker bit cells T1, T2 and T3 as the marker bit unit 304, a mechanism of majority vote can be performed. For example, if the data of two of the marker bit cells T1, T2 and T3 are read as "1" (or "0"), the marker bit can be referred to 1 ("0"). Therefore, one bit loss can be tolerant. For example, if five cells are used as the marker bit, error only occurs in a case of two-bit loss. Therefore, in this configuration, the accuracy for marker bit can be further increased. In addition, like the configuration shown in FIG.

4, the marker bit cells T1, T2 and T3 may be used as a part of an ECC (error correction code) codeword.

As described above, the memory structure may comprise at least one marker bit column having at least one marker bit unit used as a marker bit, and the at least one marker bit unit being coupled to at least one of the plurality of word lines. The embodiments in FIGS. 1A, 1B, 2A and 2B show configurations that one marker bit column BLe is provided and each marker bit unit has one marker bit cell M0(~M63) or coupled to the marker bit column. The embodiments in FIG. 4 shows a configuration that plural marker bit columns (such as BLe0~BLe2) are provided and each marker bit unit has plural marker bit cells (such as T1~T3) coupled to the marker bit columns.

In addition, according to the embodiment of the disclosure, by providing at least one marker bit for each block of the memory array, the marker bit will be pre-read first to determine whether the block to be erased is in the erase state or the program state. If the block to be erased is in the erase state, it is not necessary to perform the block erase operation even though the erase command is received. Since the time for pre-reading the marker bit(s) is much less than pre-reading the whole block, the pre-reading time can be significantly reduced and the time for performing the block erase operation can be also reduced.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A memory structure with marker bit, comprising:
   a memory array, having a plurality of blocks, each of the plurality of blocks having a plurality of word lines coupled to memory cells;
   at least one marker bit column having at least one marker bit unit used as a marker bit, and the at least one marker bit unit being coupled to at least one of the plurality of word lines; and
   a controller performing controls on the memory array,
   wherein in performing a program operation to the memory array, for each of the plurality of blocks, the controller pre-reads data from the at least one marker bit unit, and programs the at least one marker bit unit and performs the program operation to the memory array if the data is a first digital value that indicates an erase state; and
   in performing a block erase operation to the blocks of the memory array, for each of the plurality of blocks, the controller pre-reads the data from the at least one marker bit unit and erases the at least one marker bit unit during performing the block erase operation to the blocks of the memory array if the data is a second digital value that indicates a program state, and the controller skips the block erase operation if the data is the first digital value.

2. The memory structure with marker bit of claim 1, wherein in performing the program operation, the controller further performs the program operation to the memory array and the skips programming the at least one marker bit unit if the data is the second digital value.

3. The memory structure with marker bit of claim 1, wherein in a case that one marker bit column and one marker bit unit are provided, the one marker bit unit has one marker bit cell and the one marker bit cell is coupled to a first word line of the plurality of word lines.

4. The memory structure with marker bit of claim 3, wherein in performing the program operation, the controller pre-reads the data from the one marker bit unit, and programs the one marker bit unit and performs the program operation to the memory array if the data is the first digital value; and
   in performing the block erase operation, the controller erases the one marker bit unit during performing the block erase operation if the one marker bit unit has the data of the second digital value, and the controller skips the block erase operation if the data is the first digital value.

5. The memory structure with marker bit of claim 1, wherein in a case that one marker bit column and a plurality of marker bit units are provided, each of the marker bit units has one marker bit cell and the plurality of marker bit units are one-to-one coupled to the plurality of word lines respectively.

6. The memory structure with marker bit of claim 5, wherein
   in performing the program operation, the controller pre-reads the data from one of plurality of marker bit units, and programs the one of plurality of marker bit units and performs the program operation to the memory array if the data is the first digital value; and
   in performing the block erase operation, the controller erases the plurality of marker bit units during performing the block erase operation if any of the plurality of marker bit units has data of the second digital value, and the controller skips the block erase operation if the data has the first digital value.

7. The memory structure with marker bit of claim 1, wherein the at least one marker bit unit comprises one marker bit cell.

8. The memory structure of claim 1, wherein the at least one marker bit column has plural marker bit columns, and the at least one marker bit unit comprises a plurality of marker bit cells.

9. The memory structure of claim 1, wherein the data in the at least one marker bit unit is used as a part of an ECC codeword.

10. The memory structure of claim 1, wherein the first digital value is 1 and the second digital value is 0.

11. An operation method for a memory structure with marker bit, the memory structure including a memory array that has a plurality of blocks and each of the plurality of blocks has a plurality of word lines; and at least one marker bit column having at least one marker bit unit used as a marker bit, and the at least one marker bit unit being coupled to at least one of the plurality of word lines, the operation method comprising:
   in performing a program operation to the memory array, for each of the plurality of blocks, pre-reading data from the at least one marker bit unit, and programing the at least one marker bit unit and performs the program operation to the memory array if the data is a first digital value that indicates an erase state; and
   in performing a block erase operation to the blocks of the memory array, for each of the plurality of blocks, pre-reading the data from the at least one marker bit unit, erasing the at least one marker bit unit during performing the block erase operation to the blocks of the memory array if the data is a second digital value that indicates a program state, and the skipping the block erase operation if the data is the first digital value.

12. The operation method of claim 11, in performing the program operation, further performing the program operation to the memory array and the skips programming the at least one marker bit unit if the data is the second digital value.

13. The operation method of claim 11, wherein in a case that one marker bit column and one marker bit unit are provided, the one marker bit unit has one marker bit cell and the one marker bit cell is coupled to a first word line of the plurality of word lines, the operation method comprises:
in performing the program operation, the controller pre-reads the data from the one marker bit unit, and programs the one marker bit unit and performs the program operation to the memory array if the data is the first digital value; and
in performing the block erase operation, the controller erases the one marker bit unit during performing the block erase operation if the one marker bit unit has data of the second digital value, and the controller skips the block erase operation if the data is the first digital value.

14. The operation method of claim 11, wherein in a case that one marker bit column and a plurality of marker bit units are provided, each of the marker bit units has one marker bit cell and the plurality of marker bit units are one-to-one coupled to the plurality of word lines respectively, the operation method comprises:
in performing the program operation, the controller pre-reads the data from one of the plurality of marker bit units, and programs the one of plurality of marker bit units and performs the program operation to the memory array if the data is the first digital value; and
in performing the block erase operation, the controller erases the plurality of marker bit units during performing the block erase operation if any of the plurality of marker bit units has data of the second digital value, and the controller skips the block erase operation if the data has the first digital value.

15. The operation method of claim 11, further using the data in the at least one marker bit unit as a part of an ECC codeword.

16. The operation method of claim 11, wherein the first digital value is 1 and the second digital value is 0.

* * * * *